United States Patent [19]

Downie et al.

[11] Patent Number: 5,570,505
[45] Date of Patent: Nov. 5, 1996

[54] METHOD OF MANUFACTURING A CIRCUIT MODULE

[75] Inventors: Alan P. Downie; Peter Gallagher, both of Greenock; John J. Garrity; Brian L. Robertson, both of Gourock, all of Scotland

[73] Assignee: International Business Machines Corporation, Armonk, N.Y.

[21] Appl. No.: 455,775

[22] Filed: May 31, 1995

Related U.S. Application Data

[62] Division of Ser. No. 254,342, Jun. 3, 1994, Pat. No. 5,471,368.

[30] Foreign Application Priority Data

Nov. 16, 1993 [GB] United Kingdom ............... 9323646

[51] Int. Cl.$^6$ .................................................. H05K 3/34
[52] U.S. Cl. ................. 29/840; 29/412; 29/852; 228/180.21; 427/97
[58] Field of Search ................... 29/412, 417, 840, 29/852, 843; 174/263, 264, 266; 228/180.21, 180.22; 361/760, 768, 784; 427/97

[56] References Cited

U.S. PATENT DOCUMENTS

| | | | |
|---|---|---|---|
| 3,597,839 | 8/1971 | Jaccodine | 29/412 X |
| 4,216,523 | 8/1980 | Harford | 29/412 X |
| 4,343,084 | 8/1982 | Wilmarth | 29/412 X |
| 4,790,894 | 12/1988 | Homma et al. | 156/250 |
| 4,890,383 | 1/1990 | Lumbard et al. | 29/852 X |
| 4,898,636 | 2/1990 | Rigling | 29/852 X |
| 4,926,546 | 5/1990 | Polczynski et al. | 29/840 |

FOREIGN PATENT DOCUMENTS

| | | | |
|---|---|---|---|
| 2503977 | 10/1982 | France . | |
| 3522647 | 1/1987 | Germany . | |
| 9207613 | 8/1992 | Germany . | |
| 3151032 | 6/1988 | Japan | 257/784 |
| 6006023 | 1/1994 | Japan | 29/840 |
| 6132665 | 5/1994 | Japan | 29/840 |

OTHER PUBLICATIONS

IBM Technical Disclosure Bulletin, vol. 35, No. 7, Dec. 1992, pp. 330–331, entitled "Module Interconnection Using Hybrid Attachment".

Primary Examiner—Peter Vo
Attorney, Agent, or Firm—Aziz M. Ahsan

[57] ABSTRACT

A direct chip attach module (DCAM) 10, comprises of one or more electronic components 30, electrically bonded to a printed circuit 40, on a substrate 20. The DCAM 10, is bonded to an electronic circuit assembly by connection pads 50, formed on the edge of the DCAM substrate 10. This enables easy visual inspection of solder joints between the DCAM and the assembly.

DCAM substrates 10, are initially formed in a panel form 70, and vias 50, are drilled and filled with electrically conductive media 55, at predetermined connection points. The DCAM 10, is then excised from the parent panel 70, and the cut vias provide connection pads 55, along the edge of the substrate 10.

9 Claims, 2 Drawing Sheets

METHOD OF MANUFACTURING A CIRCUIT MODULE

CROSS-REFERENCE TO A RELATED PATENT APPLICATION

This patent application is a Divisional patent application of U.S. patent application Ser. No. 08/254,342, filed on Jun. 3, 1994, now U.S. Pat. No. 5,471,368, which issued on Nov. 28, 1995.

FIELD OF THE INVENTION

The present invention relates to the assembly of electronic circuits. Specifically the present invention relates to the attachment of circuit components onto planar circuit boards. More specifically the present invention relates to an improved direct chip attach module.

BACKGROUND OF THE INVENTION

A problem in the manufacture of integrated circuits and planar circuit boards is the attachment of chips and other circuit components onto an electronic carrier, such as a substrate or board or printed circuit card, to name a few, and the making of interconnections between components attached to a common substrate.

A well known method for attaching components is to solder the component pins into holes drilled at regular intervals through the substrate (or card). This is commonly known as pin in hole technology (PIH). An example of PIH technology is shown in FIG. 1A, where a chip 30, having pins 31, is secured inside a hole 32, of a substrate 35, having electrical circuit lines 33. Problems with this technology are that it is not practical to attach components to both sides of the card and the components with associated pins take up a lot of space on the card.

An alternative method of attaching components and chips is by utilizing surface mount technology (SMT) in which components are attached to the surface of a printed circuit card. Holes are only drilled where necessary in order to make interconnections between wiring layers of the cards. An example of a component attached by SMT is shown in FIG. 1B, where the pins 31, of the chip 30, are secured to a pad 34, which is on the surface of a printed circuit card 35. Advantages of this system are reduced drilling costs and more card space for wiring. Components can be easily attached to both sides of the printed circuit card and can be mounted closer together. As the component lead-to-lead pitch is narrower in SMT than the pin-to-pin pitch in PIH, components can have more leads and therefore more functions. Furthermore many holes close together have a weakening effect on the mechanical strength of the substrate or board. Modern needs demand more dense circuit packages and with this comes more complex assembly processes.

Accordingly, another method developed for attaching chips 30, to a substrate 35, is direct chip attach (DCA). As with SMT holes are only drilled where necessary to make interconnections between wiring layers in the card. However, the chips have electrically conductive pads on their underside, rather than legs or pins, for connection. An example of a DCA chip is shown in FIG. 1C. The connections between the chip 30, and the substrate 35, cannot actually be seen as they are underneath the chip 30. These chips are typically attached to a circuit board by C-4 (Controlled Collapse Chip Connection) soldering, in which solder balls are formed or placed on the circuit connection pads. The leadless chip 30, is then placed on top of the substrate 35, and the solder is reflowed by methods well known in the art, such as, hot vapor reflow, infrared radiation, to name a few.

Another method of direct chip attachment is that of Direct Chip Attach Module (DCAM) in which the chips, such as, silicon chips, are mounted onto a substrate using soldering techniques, such as, C-4 soldering. The substrate in turn has solderable pads on its underside which are used to solder the DCAM to a circuit board, such as, by the use of a printed solder paste and some form of heat application.

DCAM enables increased circuit density and allows reductions in the size of printed circuit cards. However, one of the problems experienced with the assembly of DCAM components onto planar boards is that once attached, there are no easy visual ways of inspecting the quality of a solder joint beneath a component and the joints are very difficult to get to with a heat source to reflow the joint during repair. Also, if a component is bonded too close to the surface of the substrate, flux and other contaminants could be entrapped resulting in unwanted solder balls and voids and the necessary removal and reattachment of the component.

The method and structure of this invention produces an electronic circuit module which enables dense packaging of components onto a substrate with the added advantage that it provides for easy visual inspection of solder connections between the circuit module and an electronic circuit to which it is attached.

PURPOSES AND SUMMARY OF THE INVENTION

One purpose of this invention is to produce an electronic circuit module which enables dense packaging of components onto a substrate.

Another purpose of this invention is to provide for easy visual inspection of solder connections between the circuit module and an electronic circuit to which it is attached.

In one aspect the present invention is a method of manufacturing an electronic circuit module comprising the steps of:

(a) bonding at least one electronic component to a parent substrate carrying at least one printed circuit line, such that at least a portion of said at least one electronic component is in electrical contact with at least a portion of said at least one printed circuit line, (b) forming at least one hole through said parent substrate at least at one predetermined connection point, such that said at least one hole passes through at least one of said at least one printed circuit line, (c) filling said at least one hole with at least one electrically conductive material, and (d) removing a portion from said parent substrate along at least a portion of said at least one electrically conductive material to form a first substrate, such that said first substrate has secured to it at least one of said attached component, and wherein at least a portion of said at least one electrically conductive material forms at least one electrically conductive connection pad along at least one edge of said first substrate, thereby forming said electronic circuit module.

In another aspect the present invention is an electronic circuit module comprising:

a substrate carrying at least one printed circuit line, at least one electronic component secured to said substrate so as to be in electrical contact with said at least one printed circuit line, and wherein said substrate has at least one electrically conductive connection pad formed along at least one edge.

In yet another aspect the present invention is an electronic circuit assembly comprising:

- a first substrate carrying at least one first printed circuit line,
- at least one first electronic component secured to said first substrate, such that said at least one first electronic component is in electrical contact with said at least one first printed circuit line,
- a second substrate carrying at least one second printed circuit line,
- at least one second electronic component secured to said second substrate, such that said at least one second electronic component is in electrical contact with said at least one second printed circuit line, and
- at least one electrically conductive connection pad along at least one edge of said second substrate to provide at least one electrical contact between said at least one first printed circuit line and said at least one second printed circuit line, to form said electronic circuit assembly.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAIL DESCRIPTION OF THE INVENTION

Figure 1A:
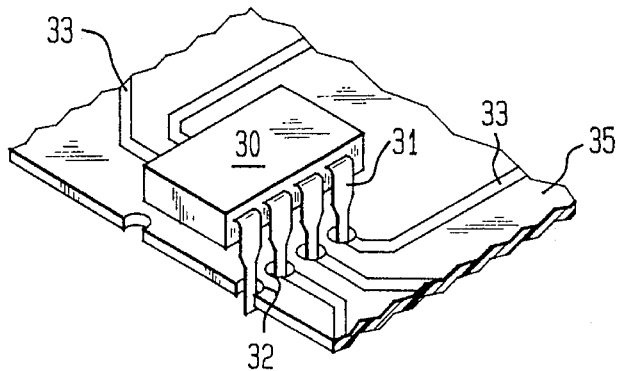
FIG. 1A, shows an electronic component bonded to a substrate using prior art pin in hole (PIN) technology.
Figure 1B:
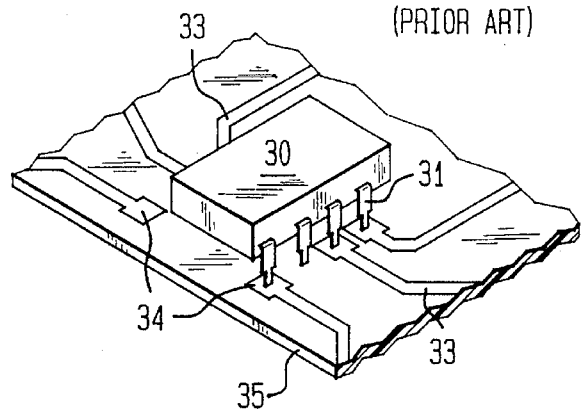
FIG. 1B, shows an electronic component bonded to a substrate using prior art surface mount technology (SMT).
Figure 1C:
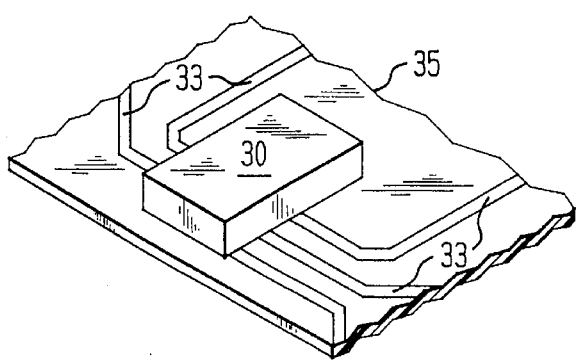
FIG. 1C, shows an electronic component bonded to a substrate using prior art direct chip attach (DCA) technology.
Figure 2A:
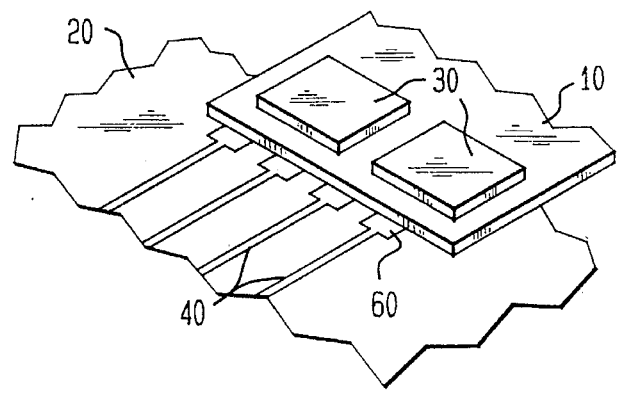
FIG. 2A, shows a prior art direct chip attach module (DCAM) attached to a substrate.
Figure 2B:
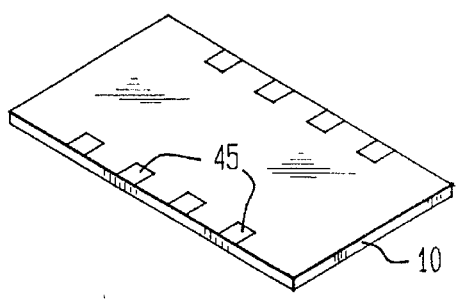
FIG. 2B, shows the underside of the direct chip attach module of FIG. 2A.

FIGS. 2A and 2B, show a prior art direct chip attach module (DCAM) 10, bonded to a substrate 20, by direct chip attachment method. The module 10, includes a pair of chips 30, but may of course include more chips and/or other components depending on the function which the module 10, is required to execute. Such module 10, is generally a field replaceable unit i.e. one which is replaced rather than repaired when defective. The module 10, is bonded to the circuit lines 40, of the substrate 20, by solder located between the connection pads 45, of the module 10, and corresponding connection pads 60, that are on the substrate 20.

The connection pads 45, of the module 10, cannot be seen under the module 10, shown in FIG. 2A, but are shown as connection pads 45, in FIG. 2B.

The direct chip attach modules (DCAMs) shown in FIGS. 2A and 2B, are conventionally manufactured in panel form i.e. manufactured on a wafer and then diced or excised, by method well known in the art. The wafer is preferably FR4 substrate.

Figure 3:
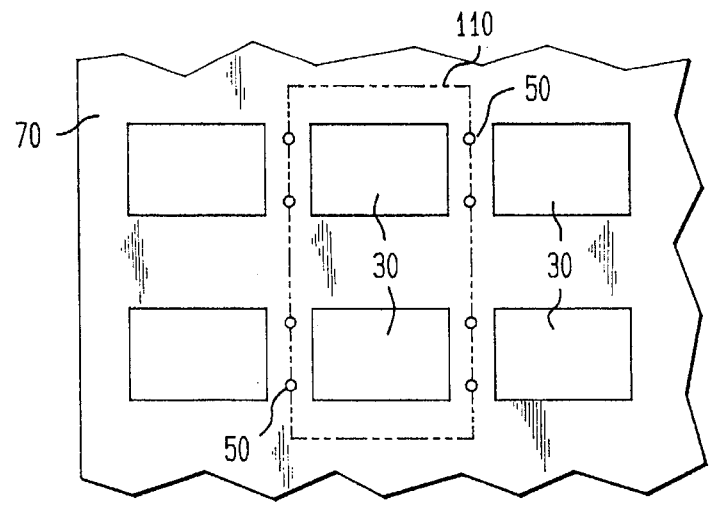
FIG. 3, shows one embodiment of the direct chip attach modules in panel form of this invention.
Figure 4:
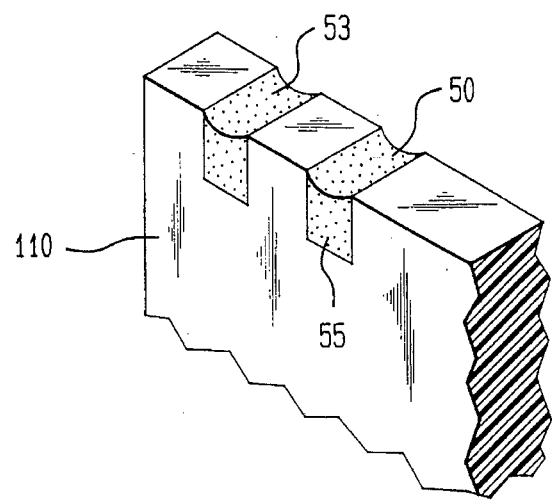
FIG. 4, shows the underside of a direct chip attach module of FIG. 3, after routing with the electrically conductive pads with the electrically conductive vias exposed.

In accordance with the present invention the inventive modules 110, are manufactured in panel form 70, and at least one via 50, is formed at the edge of at least one connection pad as is shown in FIG. 3. The via 50, is then filled with an electrically conductive material 53, such as by plating. In accordance with a preferred embodiment of the invention, the vias 50, are typically filled or plated with copper. When the DCAM 110, is routed or diced or excised or cut from the parent panel 70, the router cuts through each via 50, cutting the via 50, typically in half or into two, as is shown by the dotted line in FIG. 3, to leave a DCAM 110, with typical dimensions of about 10 mm by 20 mm. This results in the formation of an electrically conductive pad 55, having electrically conductive material 53, which extends up or along the side of the DCAM 110, as shown in FIG. 4.

Figure 5:
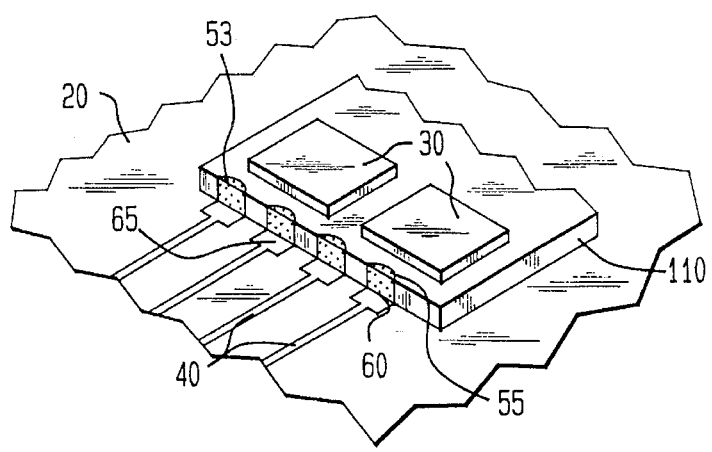
FIG. 5, shows a direct chip attach module bonded to a printed circuit board in accordance with the present invention.

The DCAM 110, as shown in FIG. 5, is then normally bonded to connection pads 60, of a printed circuit card or a substrate 20, by a conventional bonding method, such as by soldering or brazing or preferably by means of C-4 solder balls, to name a few.

Solder joint fillet 65, is visible at connection pad 60, for inspection purposes and is much more accessible for repair tools.

This inventive method of bonding components maintains the advantage of being able to densely pack components onto a substrate with the added advantage of being able to see the connections.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of manufacturing an electronic circuit module comprising the steps of:

(a) bonding at least one electronic component to a parent substrate carrying at least one printed circuit line, such that at least a portion of said at least one electronic component is in electrical contact with at least a portion of said at least one printed circuit line, (b) forming at least one hole through said parent substrate at least at one predetermined connection point, such that said at least one hole passes through at least one of said at least one printed circuit line, (c) filling said at least one hole with at least one electrically conductive material, and (d) removing a portion from said parent substrate along at least a portion of said at least one electrically conductive material to form a first substrate, such that said first substrate has secured to it at least one of said attached component, and wherein at least a portion of said at least one electrically conductive material forms at least one electrically conductive connection pad along at least one edge of said first substrate, thereby forming said electronic circuit module.

2. The method of claim 1, wherein said electrically conductive material is copper or a copper alloy.

3. The method of claim 1, wherein said electrically conductive material is filled in said hole by plating.

4. The method of claim 1, wherein said hole is cut in half when said first substrate is formed.

5. The method of claim 1, wherein said first substrate is approximately 10 mm by 20 mm.

6. The method of claim 1, wherein at least a portion of said first substrate is secured to an electronic carrier by at least one method selected from soldering, brazing or C-4 bonding.

7. The method of claim 1, wherein said electronic circuit module is secured to an electronic carrier such that at least a portion of said module is in electrical contact with at least a portion of a printed circuit line on said electronic carrier.

8. The method of claim 7, wherein said electrical contact between said printed circuit line on said electronic carrier and said module is made through said electrically conductive connection pad on at least one edge of said module.

9. The method of claim 1, wherein said at least one electronic component is bonded to said parent substrate by solder bonding.

\* \* \* \* \*